United States Patent
Daman et al.

(10) Patent No.: US 10,756,734 B2
(45) Date of Patent: Aug. 25, 2020

(54) TOUCH KEY FOR INTERFACE TO AIRCRAFT AVIONICS SYSTEMS

(71) Applicant: Spectralux Corporation, Redmond, WA (US)

(72) Inventors: Douglas W. Daman, Poulsbo, WA (US); David E. Hiney, Woodinville, WA (US); James A. Reynolds, Bothell, WA (US)

(73) Assignee: SPECTRALUX CORPORATION, Redmond, WA (US)

( * ) Notice: Subject to any disclaimer, the term of this patent is extended or adjusted under 35 U.S.C. 154(b) by 0 days.

(21) Appl. No.: 15/482,536

(22) Filed: Apr. 7, 2017

(65) Prior Publication Data

US 2017/0300139 A1    Oct. 19, 2017

Related U.S. Application Data

(60) Provisional application No. 62/323,085, filed on Apr. 15, 2016.

(51) Int. Cl.
*H03K 17/96* (2006.01)
*H03K 17/965* (2006.01)

(52) U.S. Cl.
CPC ....... *H03K 17/962* (2013.01); *H03K 17/9622* (2013.01); *H03K 17/965* (2013.01)

(58) Field of Classification Search
CPC ........ G06F 3/041; G06F 3/044; G06F 3/0416; G06F 3/0488; H03K 17/962; G09G 2380/12
See application file for complete search history.

(56) References Cited

U.S. PATENT DOCUMENTS

| | | | | |
|---|---|---|---|---|
| 8,633,913 B1* | 1/2014 | Raghu | ................. | G08G 5/0021 340/945 |
| 2007/0198141 A1* | 8/2007 | Moore | ................... | B64D 43/00 701/3 |
| 2008/0184166 A1* | 7/2008 | Getson | ................. | G01C 23/005 715/810 |
| 2012/0240044 A1* | 9/2012 | Johnson | ................ | G06F 3/0481 715/716 |
| 2014/0028614 A1* | 1/2014 | Bae | ......................... | G06F 3/044 345/174 |
| 2014/0035803 A1* | 2/2014 | Melkers | .................... | G05G 7/10 345/156 |
| 2014/0078086 A1* | 3/2014 | Bledsoe | ................. | G06F 3/041 345/173 |
| 2015/0126246 A1* | 5/2015 | Lombardi | ............... | G06F 3/041 455/556.1 |
| 2016/0179327 A1* | 6/2016 | Zammit-Mangion | ........................ | G01C 23/00 701/7 |

* cited by examiner

*Primary Examiner* — Alexander Eisen
*Assistant Examiner* — Kebede T Teshome
(74) *Attorney, Agent, or Firm* — Davis Wright Tremaine LLP; George C. Rondeau, Jr.; Heather M. Colburn

(57) ABSTRACT

A touch key of an interface for an aircraft avionics system. The touch key includes a button, a mechanical switch, and a sensor. The mechanical switch is configured to be actuated when the button is pressed. Actuation of the mechanical switch sends a switch signal to the aircraft avionics system. The sensor is configured to detect when the button is being touched independent of whether the button is being pressed. The sensor sends a touch signal indicating that the button is being touched to the aircraft avionics system.

12 Claims, 4 Drawing Sheets

TOUCH KEY FOR INTERFACE TO AIRCRAFT AVIONICS SYSTEMS

CROSS REFERENCE TO RELATED APPLICATIONS

This application claims the benefit of U.S. Provisional Application No. 62/323,085, filed on Apr. 15, 2016, which is incorporated herein by reference in its entirety.

BACKGROUND OF THE INVENTION

Field of the Invention

The present invention is directed generally to interfaces for use with aircraft avionics systems.

Description of the Related Art

Accurate data entry is a necessity for aircraft avionics systems. Therefore, need exists for user interfaces configured to facilitate accurate data entry. The present application provides these and other advantages as will be apparent from the following detailed description and accompanying figures.

BRIEF DESCRIPTION OF THE SEVERAL VIEWS OF THE DRAWINGS

Like reference numerals have been used in the figures to identify like components.

DETAILED DESCRIPTION OF THE INVENTION

Figure 4:
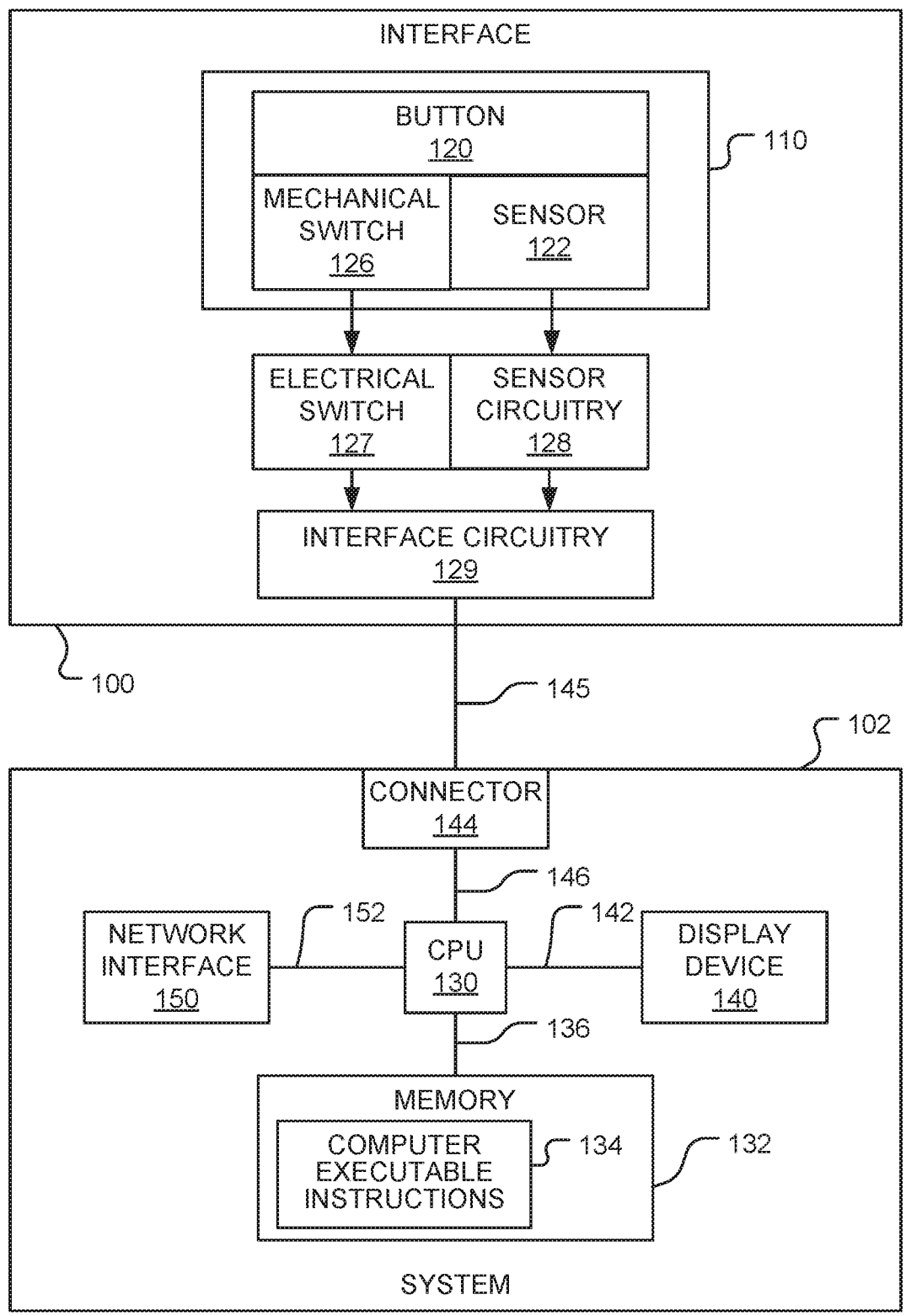
FIG. 4 is a block diagram of an interface including the touch key connected to a system including a display device.

FIG. 4 illustrates an interface 100 connected to a system 102. The system 102 may be an aircraft avionics system such as an Aircraft Communications Addressing and Reporting System ("ACARS"), a Controller-Pilot Data Link Communications ("CPDLC") system, an Aeronautical Telecommunications Network ("ATN") system, a Future Air Navigation System ("FANS"), and the like.

The interface 100 includes at least one tactile touch key 110. The touch key 110 includes a button 120, a touch sensor 122, and a mechanical switch 126. The touch sensor 122 is configured to detect when a user 124 (see FIGS. 2 and 3) is touching the button 120 (see FIG. 2). The button 120 is attached to the mechanical switch 126, which is configured to detect when the user 124 (see FIGS. 2 and 3) has pressed or actuated the button 120. Thus, the touch key 110 uniquely combines touch detect technology (e.g., the touch sensor 122) with the mechanical switch 126. This improves the human-machine interface 100, reduces the chances of error, and creates a potential for additional capabilities.

The mechanical switch 126 may control an electrical switch 127. For example, when the mechanical switch 126 is actuated (by pressing on the button 120), the mechanical switch 126 may close the electrical switch 127. When the button 120 is released or no longer pressed, the mechanical switch 126 may open the electrical switch 127. Thus, the electrical switch 127 has a switch state, open or closed. The mechanical switch 126 may be implemented as a momentary pushbutton switch, a rocker switch, or other type of switch.

The touch sensor 122 may include or be connected to touch detect or sensor circuitry 128. The circuitry 128 is configured to generate a signal that indicates a touch state of the button 120. The touch state (touching or not touching) indicates whether the user 124 is or is not touching the button 120.

The touch sensor 122 may be implemented as a proximity sensor that outputs an electronic field. The electronic field is disturbed by the user 124 (see FIGS. 2 and 3) when the user 124 touches the button 120. When this occurs, the touch sensor 122 and/or the circuitry 128 detect the disturbance and generate the signal that indicates the touch state (touching) of the button 120. In such embodiments, the touch sensor 122 and/or the circuitry 128 may be attached to (e.g., embedded in) the button 120. However, this is not a requirement. In some embodiments, a portion of the touch sensor 122 and/or the circuitry 128 may be positioned behind the button 120 and optionally attached to a circuit board (not shown) positioned under the touch key 110.

Alternatively, the touch sensor 122 may use capacitance to detect when the user 124 is touching the button 120. In such embodiments, the circuitry 128 may be implemented as capacitive touch detect circuitry. Further, the button 120 may include a conductive pushbutton cap connected to the mechanical switch 126 (which provides an actuator structure). The conductive pushbutton cap provides an electrical connection with the user 124 (see FIGS. 2 and 3), which is detected by the touch sensor 122. The touch sensor 122 and/or the circuitry 128 may be embedded in the conductive pushbutton cap. In such embodiments, the touch sensor 122 may be characterized as including the button 120.

The touch key 110 and/or the interface 100 may include interface circuitry 129 configured to communicate the switch state (open or closed) and the touch state (touching or not touching) to the system 102.

Figure 1:
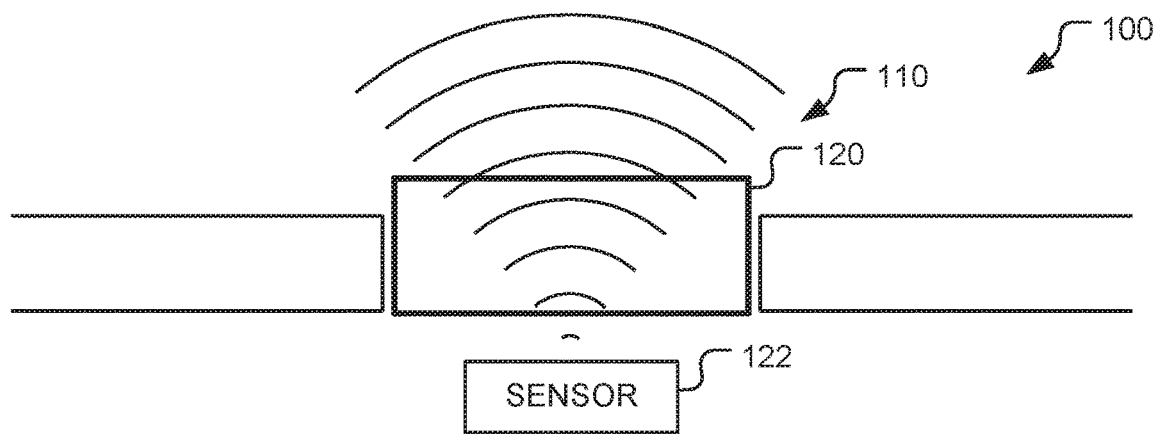
FIG. 1 is a block diagram illustrating a touch key.

FIG. 1 illustrates the touch key 110 before the user 124 (see FIGS. 2 and 3) touches the button 120. The touch sensor 122 and/or the circuitry 128 (see FIG. 4) detects that the button 120 is not being touched (meaning the touch state is "not touching"). The circuitry 128 (see FIG. 4) may generate a signal indicating the touch state and provide the signal to the interface circuitry 129 (see FIG. 4). The interface circuitry 129 (see FIG. 4) provides the touch state to the system 102 (see FIG. 4).

Figure 2:
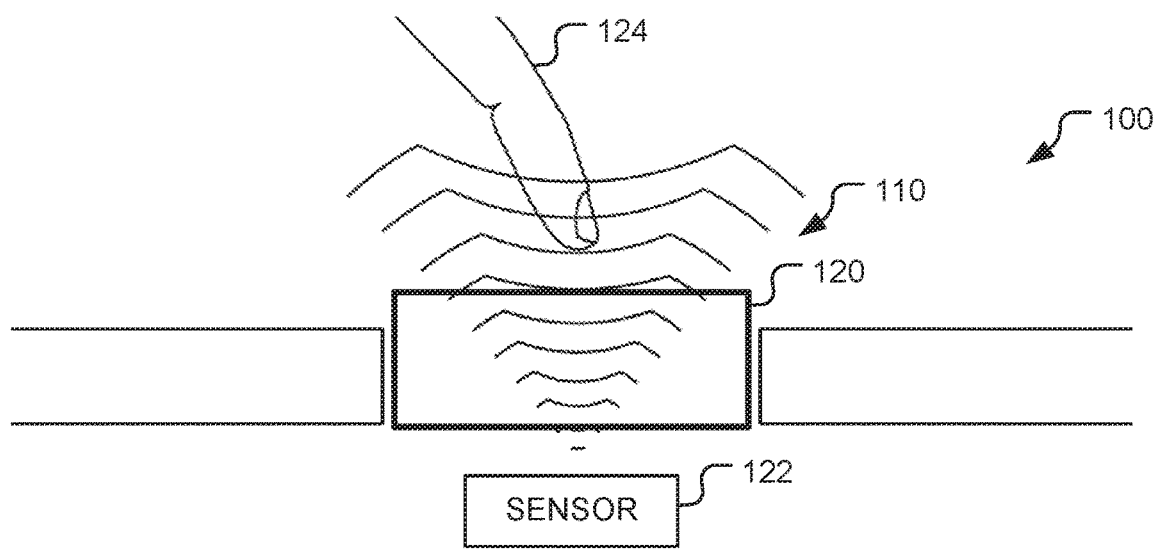
FIG. 2 is a block diagram of the touch key just before the touch key is touched by a user.

Referring to FIG. 2, when the user 124 places a finger on the button 120, and prior to physically actuating (e.g., depressing) the button 120, the touch sensor 122 and/or the circuitry 128 (see FIG. 4) detects that the button 120 is being touched (meaning the touch state is "touching"). The circuitry 128 (see FIG. 4) generates the signal indicating the touch state and provides the signal to the interface circuitry 129 (see FIG. 4). The interface circuitry 129 (see FIG. 4) provides the touch state to the system 102 (see FIG. 4), which detects or generates a (touching) touch event. If the user 124 stops touching the button 120, the touch sensor 122 and/or the circuitry 128 (see FIG. 4) detects that the button 120 is not being touched (meaning the touch state is "not touching"). The touch sensor 122 and/or the circuitry 128

(see FIG. 4) may generate a signal indicating the touch state and provide the signal to the interface circuitry 129 (see FIG. 4), The interface circuitry 129 (see FIG. 4) provides the touch state to the system 102 (see FIG. 4), which may detect or generate a (not touching) touch event.

Alternatively, the touch sensor 122 and/or the circuitry 128 (see FIG. 4) may simply send no signals when the button 120 is not being touched. In such embodiments, the system 102 assumes the button 120 is not being touched until the system 102 receives the touch state (touching). The touch sensor 122 and/or the circuitry 128 (see FIG. 4) may continue to send the touch state to the interface circuitry 129 (see FIG. 4), which provides the touch state to the system 102 (see FIG. 4), until the user 124 stops touching the button 120.

By way of another non-limiting example, the touch sensor 122 and/or the circuitry 128 (see FIG. 4) may send the signal indicating the touch state to the interface circuitry 129 (see FIG. 4) whenever the touch state changes. Then, the interface circuitry 129 (see FIG. 4) provides the touch state to the system 102 (see FIG. 4).

By way of another non-limiting example, the system 102 (see FIG. 4) may send a status request to the touch sensor 122 and/or the circuitry 128 (see FIG. 4). In response to the status request, the touch sensor 122 and/or the circuitry 128 (see FIG. 4) may send the signal indicating the touch state to the interface circuitry 129 (see FIG. 4). Then, the interface circuitry 129 (see FIG. 4) provides the touch state to the system 102 (see FIG. 4).

Figure 3:
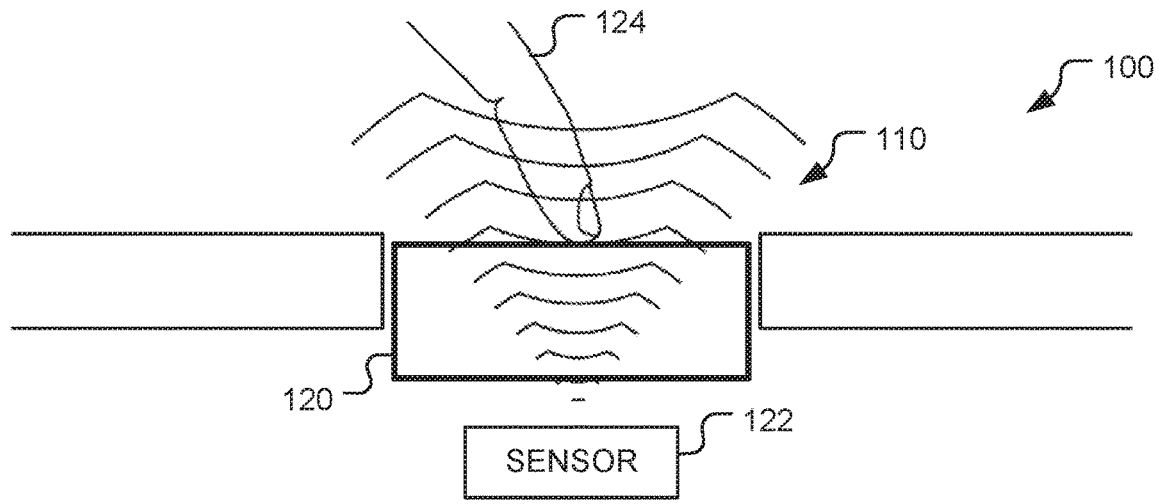
FIG. 3 is a block diagram of the touch key being actuated by the user.

Referring to FIG. 3, when the user 124 actuates (e.g., depresses) the button 120, the mechanical switch 126 (see FIG. 4) closes the electrical switch 127 (see FIG. 4). The interface circuitry 129 (see FIG. 4) communicates the switch state (closed) to the system 102 (see FIG. 4), which detects or generates a tactile event. When the user 124 stops actuating (e.g., pressing) the button 120, the mechanical switch 126 (see FIG. 4) opens the electrical switch 127 (see FIG. 4). The interface circuitry 129 (see FIG. 4) may communicate the (open) switch state to the system 102 (see FIG. 4), which may detect or generate a tactile event. Thus, the interface circuitry 129 (see FIG. 4) may send the signal indicating the switch state to the system 102 (see FIG. 4) whenever the switch state changes.

Alternatively, the interface circuitry 129 (see FIG. 4) may simply send no signals when the button 120 is not being actuated. In such embodiments, the system 102 assumes the button 120 is not being actuated until the system 102 receives the switch state (closed). The interface circuitry 129 (see FIG. 4) may continue to send the switch state to the interface circuitry 129 (see FIG. 4), which provides the switch state to the system 102 (see FIG. 4), until the user 124 stops actuating the button 120.

By way of another non-limiting example, the system 102 (see FIG. 4) may send a status request to the interface circuitry 129 (see FIG. 4). In response to the status request, the interface circuitry 129 (see FIG. 4) may send the signal indicating the switch state to the system 102 (see FIG. 4).

The sensor 122 and/or the circuitry 128 (see FIG. 4) detects whether the button 120 is being touched independent of whether the mechanical switch 126 detects the button 120 is being pressed. Thus, when the user 124 actuates the button 120, the touch sensor 122 and/or the circuitry 128 (see FIG. 4) detects that the button 120 is being touched (meaning the touch state is "touching") and provides the signal with the touch state to the interface circuitry 129 (see FIG. 4). The interface circuitry 129 (see FIG. 4) provides the touch state to the system 102 (see FIG. 4), which detects or generates a (touching) touch event.

In the example illustrated, the system 102 includes a processor or programmable central processing unit ("CPU") 130 which may be implemented by any known technology, such as a microprocessor, microcontroller, application-specific integrated circuit ("ASIC"), digital signal processor ("DSP"), or the like. The CPU 130 may be integrated into an electrical circuit, such as a conventional circuit board, that supplies power to the CPU 130. The CPU 130 may include internal memory and/or memory 132 may be coupled thereto.

The memory 132 is a computer readable medium that includes data and computer executable instructions 134 that are configured to be executed by the CPU 130. The memory 132 may be coupled to the CPU 130 by an internal bus 136. The memory 132 may be implemented using transitory and/or non-transitory memory components. The memory 132 may comprise random access memory ("RAM") and read-only memory ("ROM"). The memory 132 contains instructions and data that control the operation of the CPU 130. The memory 132 may also include a basic input/output system ("BIOS"), which contains the basic routines that help transfer information between elements within the system 102, The present invention is not limited by the specific hardware component(s) used to implement the CPU 130, the memory 132, or other components of the system 102. Optionally, the memory 132 may include internal and/or external memory devices such as hard disk drives, floppy disk drives, and optical storage devices (e.g., CD-ROM, R/W CD-ROM, DVD, and the like). The system 102 may also include one or more I/O interfaces (not shown) such as a serial interface (e.g., RS-232, RS-432, and the like), an IEEE-488 interface, a universal serial bus ("USB") interface, a parallel interface, and the like, for the communication with removable memory devices such as flash memory drives, external floppy disk drives, and the like.

The system 102 includes a display device 140 that may be implemented as a computing display, such as a standard computer monitor, LCD, or other visual display. In some embodiments, a display driver may provide an interface between the CPU 130 and the display device 140. The display device 140 may be coupled to the CPU 130 by an internal bus 142.

The system 102 includes a connector 144 configured to form a connection between the CPU 130 and the interface 100. In the embodiment illustrated, a communication cable 145 is connected to the interface circuitry 129 (e.g., through a direction connection therewith or via a connector not shown). The cable 145 may have connector (not shown) configured to be connected to the connector 144. The interface circuitry 129 may communicate with the CPU 130 via the cable 145 and the connector 144. The connector 144 may be coupled to the CPU 130 by an internal bus 146. The system 102 may include or be connected to other user interface devices, such as a standard keyboard, mouse, track ball, buttons, touch sensitive screen, wireless user input device, and the like.

The system 102 may also include a network interface 150 configured to couple the system 102 to the communication network (not shown). The network interface 150 may be coupled to the CPU 130 by an internal bus 152. The network interface 150 is configured to communicate (directly or via one or more intermediate interfaces) with the other components of the communication network (not shown) implemented using separate computing devices.

The various components of the system 102 may be coupled together by the internal buses 136, 142, 146, and 152. Each of the internal buses 136, 142, 146, and 152 may be constructed using a data bus, control bus, power bus, I/O bus, and the like.

The touch key 110 may be associated with any menu item of any menu displayable by the display device 140. For example, aircraft avionics systems (such as ACARS, CPDLC, ATN, and FANS) generate visual displays that may be displayed by the display device 140. Those visual displays may include menus with menu items that may each be associated with a different touch key (like the touch key 110). Such menus may be used for data input.

Figure 5:
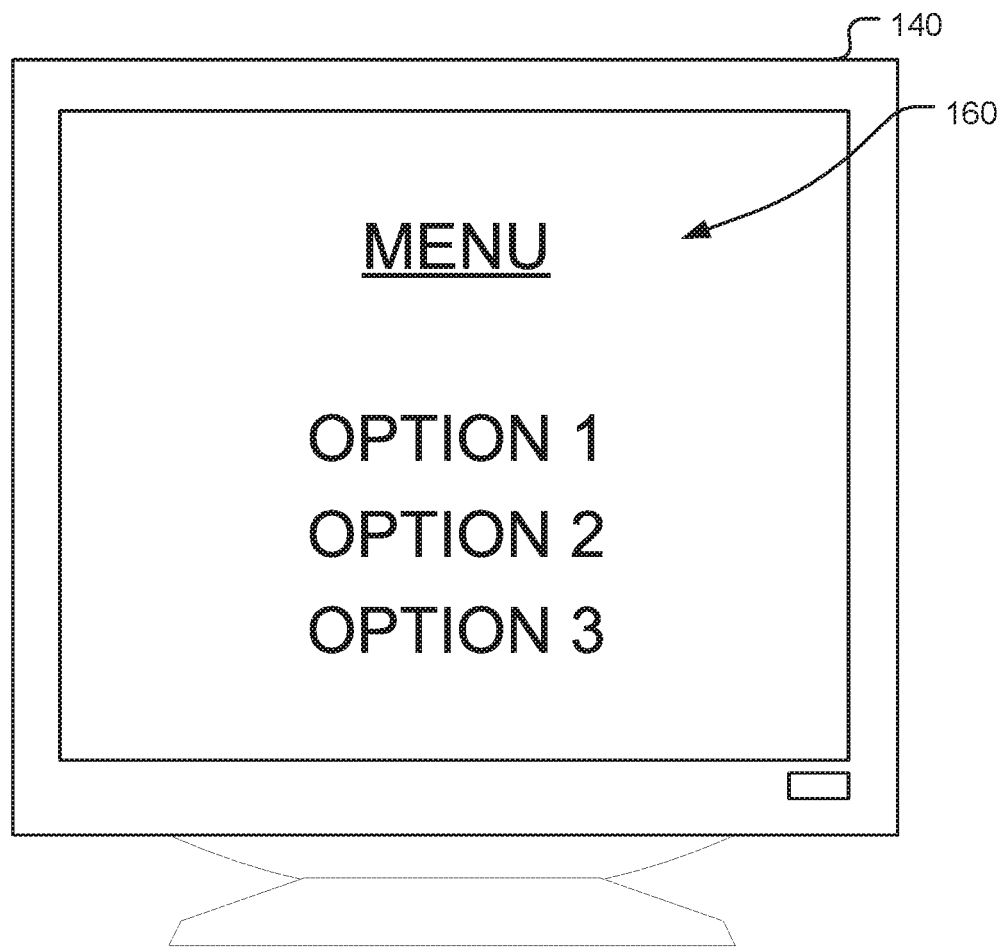
FIG. 5 is a block diagram of the interface and the display device illustrated displaying menu items.
Figure 5:
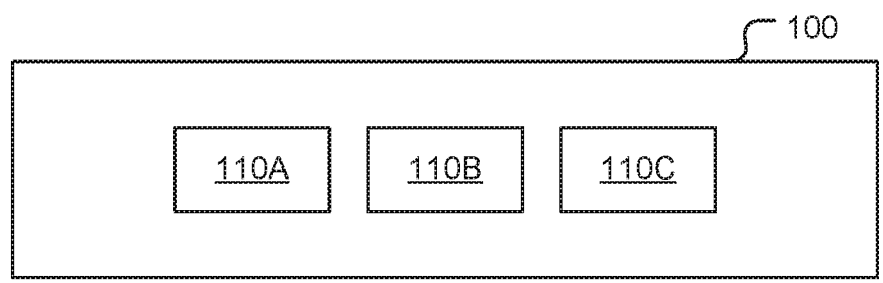

For example, FIG. 5 illustrates the display device 140 displaying a menu 160 having three menu items: Option 1, Option 2, and Option 3. In this example, the interface 100 includes three touch keys 110A-110C each like the touch key 110. The touch keys 110A-110C may each be associated with one of the menu items Option 1, Option 2, and Option 3 displayed by the display device 140. For example, the touch keys 110A-110C may be associated with the menu items Option 1, Option 2, and Option 3, respectively.

Touching one of the touch keys 110A-110C may cause the system 102 (see FIG. 4) to direct the display device 140 to change the information displayed thereby. For example, touching one of the touch keys 110A-110C may cause the system 102 (see FIG. 4) to direct the display device 140 to highlight the associated menu item. Thus, touching the touch key 110A highlights the menu item Option 1, touching the touch key 116E highlights the menu item Option 2, and touching the touch key 110C highlights the menu item Option 3. By way of another non-limiting example, touching one of the touch keys 110A-110C may cause the system 102 (see FIG. 4) to direct the display device 140 to display information about (or relevant to) the associated menu item.

Actuating one of the touch keys 110A-110C selects the associated menu item. Thus, actuating the touch key 110A selects the menu item Option 1, actuating the touch key 110B selects the menu item Option 2, and actuating the touch key 110C selects the menu item Option 3.

Thus, referring to FIG. 4, when the system 102 generates a touch event indicating the user 124 (see FIGS. 2 and 3) is touching one of the touch keys 110A-110C, the CPU 130 may direct the display device 140 to highlight the associated menu item. Then, when the system 102 generates a tactile event (switch actuation) indicating the user 124 has actuated the same touch key, the CPU 130 selects the associated menu item. This provides the user 124 (see FIGS. 2 and 3) with a visual confirmation of which menu item is going to be selected before the menu item is actually selected. Visual confirmation reduces the likelihood of pressing an incorrect key due to parallax.

One or more touch events allow the user 124 (see FIGS. 2 and 3) to scroll through different display menu options followed by a tactile event to select the menu option. For example, placing a finger on the touch key 110 more than once (or for longer than a predetermined amount of time), without actuating the mechanical switch 126, may cause the display device 140 to highlight a next menu item (and stop highlighting the previous menu item). This may be repeated to scroll sequentially through a set of menu items. This may be useful when a single touch key (like the touch key 110) is with multiple menu options.

Figure 6:
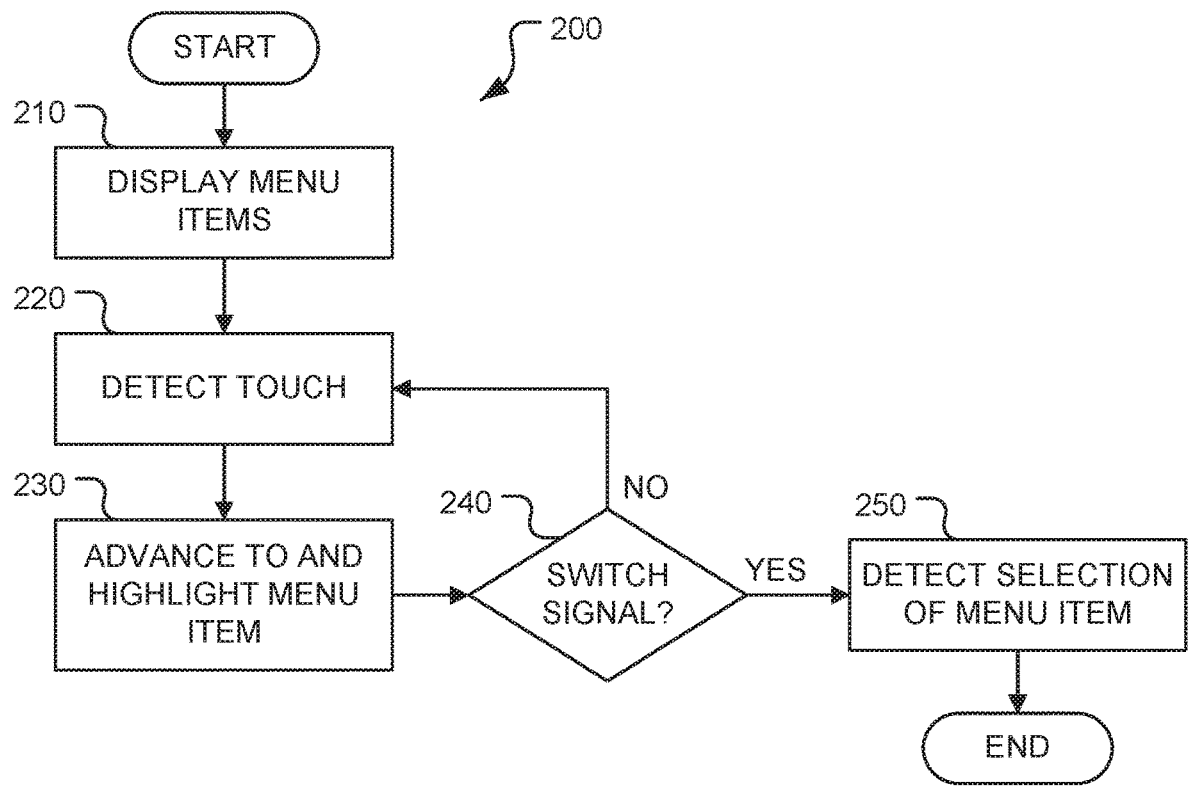
FIG. 6 is a flow diagram of a first method performed by the system.

For example, FIG. 6 is a flow diagram of a method 200 performed by the system 102 (see FIG. 4). The computer executable instructions 134 (see FIG. 4) may implement the method 200. In this example, referring to FIG. 5, the touch keys 110B and 110C may be omitted and the touch key 110A may be used with the three menu items Option 1, Option 2, and Option 3. In first block 210 (see FIG. 6), the system 102 (see FIG. 4) displays the menu items Option 1, Option 2, and Option 3 on the display device 140. Then, in block 220 (see FIG. 6), the system 102 (see FIG. 4) detects the user 124 (see FIGS. 2 and 3) has touched (but did not depress) the touch key 110A. Next, in block 230 (see FIG. 6), the system 102 (see FIG. 4) advances to a menu item (e.g., the first menu item Option 1) and instructs the display device 140 to highlight that menu item (e.g., the first menu item Option 1).

In decision block 240 (see FIG. 6), the system 102 (see FIG. 4) determines whether it has received the switch signal indicating that the user 124 has actuated the button 120. The decision in decision block 240 (see FIG. 6) is "YES" when the system 102 receives the switch signal indicating that the user 124 has actuated the button 120. Otherwise, the decision in decision block 240 (see FIG. 6) is "NO."

When the decision in decision block 240 (see FIG. 6) is "NO," the system 102 returns to block 220 (see FIG. 6) whereat the system 102 (see FIG. 4) detects the user 124 (see FIGS. 2 and 3) touched (but did not depress) the touch key 110A a second time. Thus, before the system 102 (see FIG. 4) returns to the block 220 (see FIG. 6) from the block 230 (see FIG. 6), the user 124 (see FIGS. 2 and 3) removes the user's finger and touched (but did not depress) the touch key 110A again. Then, in block 230 (see FIG. 6), the system 102 (see FIG. 4) advances to a next menu item (e.g., the second menu item Option 2) and instructs the display device 140 to highlight that menu item (e.g., the second menu item Option 2). The system 102 (see FIG. 4) also instructs the display device 140 to stop highlighting the menu item highlighted previously (e.g., the first menu item Option 1).

The blocks 230, 240, and 220 (see FIG. 6) may be repeated until the system 102 (see FIG. 4) receives the switch signal indicating that the user 124 (see FIGS. 2 and 3) has actuated the button 120. Thus, if the user 124 removes the user's finger and touches (but does not depress) the touch key 110A again, the display device 140 may highlight the third menu item Option 3. Naturally, if the user 124 removes the user's finger and touches (but does not depress) the touch key 110A again, the display device 140 may highlight the first menu item Option 1 again. In this manner, the user 124 may scroll through the menu items Option 1, Option 2, and Option 3 using only the single touch key 110A. At any time, the user 124 may depress the touch key 110A to select whichever of the menu items Option 1, Option 2, and Option 3 is highlighted.

When the decision in decision block 240 (see FIG. 6) is "YES," in block 250, the system 102 (see FIG. 4) detects the selection of the currently highlighted menu item. Then, the method 200 (see FIG. 6) terminates.

Referring to FIG. 4, touch and tactile events may also be used by the system 102 for redundancy and failure detection. The occurrence of a single event, either a touch or a tactile event, without the occurrence of a second event, may be used to detect a failure. When the touch key 110 is used in this manner, the touch key 110 may or may not be associated with a menu item. This functionality may be useful for high reliability applications.

Figure 7:
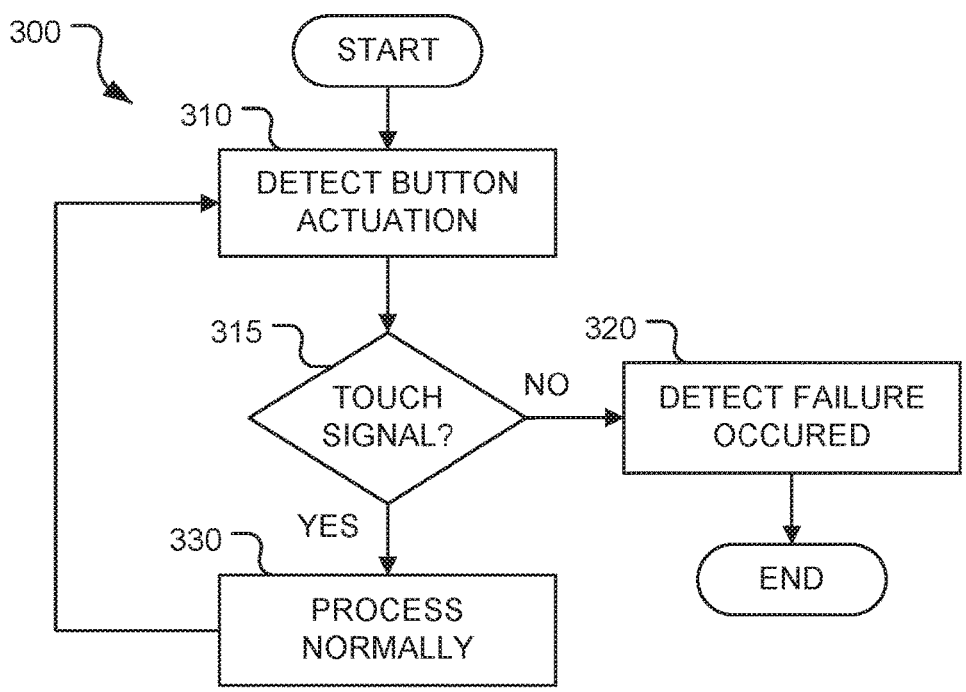
FIG. 7 is a flow diagram of a second method performed by the system.

For example, FIG. 7 is a flow diagram of a method 300 performed by the system 102 (see FIG. 4). The computer executable instructions 134 (see FIG. 4) may implement the method 300. In first block 310, the system 102 (see FIG. 4) detects that the button 120 (see FIG. 4) has been actuated.

In decision block 315, the system 102 (see FIG. 4) determines whether it received the touch signal indicating that the user 124 (see FIGS. 2 and 3) touched the button 120 (see FIG. 4) before and/or when it was actuated. The decision in decision block 315 is "YES" when the system 102 (see FIG. 4) received the touch signal. Otherwise, the decision in decision block 315 is "NO."

When the decision in decision block 315 is "NO," in block 320, the system 102 (see FIG. 4) detects a failure occurred because the button 120 (see FIG. 4) must be touched before and/or when the button 120 is actuated. Then, the method 300 terminates.

On the other hand, when the decision in decision block 315 is "YES," in block 330, the system 102 (see FIG. 4) processes the button actuation normally. Then, the system 102 returns to block 310.

The foregoing described embodiments depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Accordingly, the invention is not limited except as by the appended claims.

The invention claimed is:

1. An aircraft avionics system comprising:
   an interface with a plurality of touch keys, each of the plurality of touch keys comprising:
   (a) a button configured to move physically between a released position and a pressed position,
   (b) a mechanical switch configured to be actuated when the button is pressed into the pressed position, actuation of the mechanical switch sending a switch signal, and
   (c) a sensor positioned under the button, the sensor being configured to detect only whether or not the button is being touched independent of whether the button is in the released position or the pressed position, the sensor sending a touch signal when the sensor detects that the button is being touched, the touch signal indicating that the button is being touched;
   a display device configured to display a plurality of options, each of the plurality of options corresponding to one of the plurality of touch keys such that a particular one of the plurality of touch keys is operable to highlight only a corresponding particular one of the plurality of options when the particular touch key is touched and the particular touch key is operable to select only the corresponding particular option when the button of the particular touch key is pressed into the pressed position;
   at least one processor; and
   memory storing instructions that are executable by the at least one processor, the instructions, when executed by the at least one processor, causing the at least one processor to:
   receive the touch signal from a selected one of the plurality of touch keys,
   instruct the display device to highlight one of the plurality of options corresponding to the selected touch key after the touch signal is received from the selected touch key and before the switch signal is received from the mechanical switch of the selected touch key, and
   select the corresponding option when the switch signal is received from the mechanical switch of the selected touch key.

2. The aircraft avionics system of claim 1, wherein the sensor of each of the plurality of touch keys is a proximity sensor.

3. The aircraft avionics system of claim 1, wherein a portion of the sensor of each of the plurality of touch keys is attached to the button of the touch key.

4. The aircraft avionics system of claim 1, wherein the sensor of each of the plurality of touch keys comprises sensor circuitry configured to generate the touch signal in response to the button of the touch key having been touched.

5. The aircraft avionics system of claim 4, further comprising:
   interface circuitry configured to receive the touch signal from the sensor circuitry and send the touch signal to the aircraft avionics system.

6. The aircraft avionics system of claim 1, further comprising:
   an electrical switch configured to be actuated by actuation of the mechanical switch; and
   interface circuitry configured to detect that the electrical switch has been actuated and send the switch signal to the aircraft avionics system.

7. A method performed by an aircraft avionics system connected to an interface comprising a touch key, the method comprising:
- detecting or generating, by the aircraft avionics system, a tactile event, which is congifured to indicate that a button of the touch key has been actuated, actuation of the button being configured to cause the aircraft avionics system to perform processing;
- determining, by the aircraft avionics system, that the button was actuated when the aircraft avionics system detected or generated a touch event indicating that the button was being touched during the actuation of the button;
- determining, by the aircraft avionics system, that the button was not actuated when the aircraft avionics system did not detect or generate the touch event;
- performing, by the aircraft avionics system, the processing when the aircraft avionics system determines the button was actuated; and
- detecting, by the aircraft avionics system, a failure has occurred when the aircraft avionics system determines the button was not actuated.

8. The method of claim 7, wherein the button is configured to move physically between a released position and a pressed position, and
- the button has been actuated when the button has been moved from the released position to the pressed position.

9. The method of claim 7, further comprising:
- receiving, by the aircraft avionics system, a switch signal indicating that the button was actuated, the aircraft avionics system generating the tactile event after receiving the switch signal.

10. The method of claim 9, wherein the touch key comprises a mechanical switch configured to detect when the button has been actuated, and
- the mechanical switch is configured to send the switch signal to the aircraft avionics system when the mechanical switch detects the button has been actuated.

11. The method of claim 7, further comprising:
- receiving, by the aircraft avionics system, a touch signal from the touch key, the touch signal indicating that the button is being touched, the aircraft avionics system generating the touch event after receiving the touch signal.

12. The method of claim 11, wherein the touch key comprises a sensor positioned under the button,
- the sensor is configured to detect when the button is being touched, and
- the sensor is configured to send the touch signal to the aircraft avionics system when the sensor detects that the button is being touched.

* * * * *